United States Patent
Beintner et al.

(10) Patent No.: US 6,429,092 B1
(45) Date of Patent: Aug. 6, 2002

(54) COLLAR FORMATION BY SELECTIVE OXIDE DEPOSITION

(75) Inventors: Jochen Beintner, Wappingers Falls, NY (US); Alexander Michaelis, Dormagen (DE); Ulrike Gruening, Munich (DE); Oswald Spindler, Vaterstetten (DE); Zvonimir Gabric, Zorneding (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/596,606

(22) Filed: Jun. 19, 2000

(51) Int. Cl.⁷ ............................................. H01L 21/76
(52) U.S. Cl. ............................................. 438/425
(58) Field of Search .............................. 438/386, 387, 438/424, 425

(56) References Cited

U.S. PATENT DOCUMENTS

| | | |
|---|---|---|
| 5,399,389 A | 3/1995 | Hieber et al. |
| 5,416,041 A | 5/1995 | Schwalke |
| 5,656,535 A * | 8/1997 | Ho et al. ............... 438/386 |
| 5,763,315 A | 6/1998 | Benedict et al. |
| 5,965,203 A | 10/1999 | Gabric et al. |

OTHER PUBLICATIONS

Elbel et al., "A New STI Process Based on Selective Oxide Deposition," IEEE, Symposium on VLSI Technology Digest of Technical Papers, 1998, pp. 208–209.

* cited by examiner

Primary Examiner—Michael J. Sherry
Assistant Examiner—Lisa Kilday
(74) Attorney, Agent, or Firm—Stanton Braden

(57) ABSTRACT

A method for forming an oxide collar in a trench, in accordance with the present invention, includes forming a trench in a silicon substrate, and depositing and recessing a nitride liner in the trench to expose a portion of the silicon substrate on sidewalls of the trench. An oxide is deposited selective to the nitride liner on the portion of the silicon substrate. Residue oxide is removed from surfaces of the nitride liner to form a collar in the trench.

15 Claims, 3 Drawing Sheets

COLLAR FORMATION BY SELECTIVE OXIDE DEPOSITION

BACKGROUND

1. Technical Field

This disclosure relates to semiconductor fabrication and more particularly, to a method for forming an oxide collar in a deep trench by employing a selective oxide deposition.

2. Description of the Related Art

Semiconductor memory devices, for example, dynamic random access memories (DRAM=s), include capacitors to store data which are accessed by transistors (e.g., access transistors). Deep trench (DT) capacitors are among the types of capacitors employed in DRAM technology. Deep trench capacitors are typically buried within a semiconductor substrate. In the case of a p-type doped Si-substrate, a bottom portion of the trenches has to be n-type doped to form a buried plate (e.g., one electrode of the capacitor). This buried plate is separated from the n-type doped source region of the access transistor by a p-type doped substrate region. Consequently, there is an n/p/n junction along the vertical side of the DT.

The n/p/n junction forms a transistor by itself. This undesired transistor is called a vertical device or a parasitic device and may cause a severe leakage of charge from the buried plate to the access transistor if it is turned on. To prevent this vertical leakage, a thick dielectric layer is formed along the n/p/n junction. This dielectric layer is called the trench collar and conventionally includes $SiO_2$. This oxide collar has the same function as a gate oxide of the access transistor. The thickness of the collar oxide determines the threshold voltage $V_t$ of the parasitic device. Once the applied voltage is larger than $V_t$, the transistor is turned on and charge can detrimentally flow through the n/p/n junction. This should be avoided in the vertical device, i.e. the oxide collar thickness must be large enough that the vertical device never turns on during DRAM operation.

Conventionally voltages in the order of $V_D/2$ are applied to the DT where $V_D$ is the power supply voltage (typically, about 3 V). To prevent the vertical device from turning on a collar oxide thickness above about 25 nm is needed. Currently this collar oxide is formed by a chemical vapor deposition (CVD) or a physical vapor deposition (PVD) with a subsequent collar open etch. Alternately, a LOCOS process (localized oxidation of silicon) may be employed. The LOCOS process permits for an easier (cheaper) process integration flow if compared to the PVD/CVD processes and is more suitable for smaller ground rules (for a better trench profile). However, the conventional LOCOS collar has the following drawbacks:

1) The LOCOS oxide thickness shows a severe dependence on the Si-crystal orientation of the semiconductor substrate resulting in a non-uniform collar with thin regions. In the thin regions $V_t$ drops significantly causing reliability problems.
2) The trench opening (CD) for the LOCOS collar has to be reduced as the collar oxidation consumes silicon of the substrate.
3) To prevent oxidation of the trench sidewalls a nitride liner is needed in the bottom part of the trench where no oxide is to be formed. In case of the conventional LOCOS process, this liner has to be thicker than 5 or 6 nm to prevent oxidation of the Si interface. This thick layer is difficult to remove.

Therefore, a need exists for methods, which overcome the disadvantages of the prior art. A further need exists for a selective deposition process, which forms an oxide collar selectively on silicon.

SUMMARY OF THE INVENTION

A method for forming an oxide collar in a trench, in accordance with the present invention, includes forming a trench in a silicon substrate, and depositing and recessing a nitride liner in the trench to expose a portion of the silicon substrate on sidewalls of the trench. An oxide is deposited selective to the nitride liner on the portion of the silicon substrate. Residue oxide is removed from surfaces of the nitride liner to form a collar in the trench.

In other methods, the step of depositing an oxide selective to the nitride liner on the portion of the silicon substrate may include the step of depositing an ozone activated tetraethyl orthosilicate (TEOS) oxide selective to the nitride liner on the portion of the silicon substrate. The step of depositing an ozone activated tetraethyl orthosilicate (TEOS) oxide selective to the nitride liner on the portion of the silicon substrate may include the step of providing an initial gas flow ratio of TEOS to ozone of approximately 10 and attaining a steady-state gas flow ratio of TEOS to ozone of 0.4. The step of etching residue oxide from surfaces of the nitride liner to form a collar in the trench may include the step of wet etching the residue oxide. The step of depositing and recessing a nitride liner may include the steps of filling the trench with a resist over the nitride liner, recessing the resist to expose a portion of the nitride liner and etching the nitride liner to a top level of the resist in the trench to expose the portion of the substrate in the trench. The nitride liner may be between about 2 nm and 3 nm in thickness. The method further includes the step of forming a buried plate adjacent to a lower portion of the trench. The method may include the step of annealing the oxide.

A method for forming an oxide collar in a trench, in accordance with the present invention, includes the steps of forming a trench in a silicon substrate, depositing a nitride liner in the trench, and recessing the nitride liner to expose a portion of the silicon substrate on sidewalls of the trench. An ozone activated tetraethyl orthosilicate (TEOS) oxide is deposited selective to the nitride liner on the portion of the silicon substrate. The oxide is substantially homogenous in thickness such that the thickness of the oxide is independent of a crystallographic orientation of the portion of the substrate on which the oxide is formed. Residue oxide is etched from surfaces of the nitride liner to form a collar in the trench.

The step of depositing an ozone activated tetraethyl orthosilicate (TEOS) oxide may include the step of providing an initial gas flow ratio of TEOS to ozone of approximately 10 and attaining a steady-state gas flow ratio of TEOS to ozone of 0.4. The step of etching residue oxide from surfaces of the nitride liner to form a collar in the trench may include the step of wet etching the residue oxide. The step of recessing a nitride liner may include the steps of filling the trench with a resist over the nitride liner, recessing the resist to expose a portion of the nitride liner and etching the nitride liner to a top level of the resist in the trench to expose the portion of the substrate in the trench. The nitride liner may be between about 2 nm and 3 nm in thickness. The method may include the step of forming a buried plate adjacent to a lower portion of the trench. The method may further include the step of annealing the oxide.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides methods for selectively forming an oxide collar on silicon surfaces of a deep trench. In a preferred embodiment, a selective TEOS-Ozone deposition process is employed in which an oxide forms on a silicon surface selective to nitride. The disclosed methods permit a uniform, low temperature collar oxide formation including at least the following advantages with respect to the conventional LOCOS collar process:

1) No dependence of oxide thickness on Si-crystal orientation (reliability);
2) No consumption of trench silicon (higher value for CD);
3) Uniform oxide deposition (no birds beak effects or thinning in particular areas); and
4) No silicon nitride consumption during deposition.

These advantages will become clear from the following description and the accompanying FIGs. It is to be understood that the present invention is described in terms of an ozone assisted TEOS deposition process; however, the invention is broader and is applicable to any selective oxide deposition process. The present invention is not to be construed as limited by the examples described herein. Instead, the examples set forth herein are illustrative.

Figure 1:
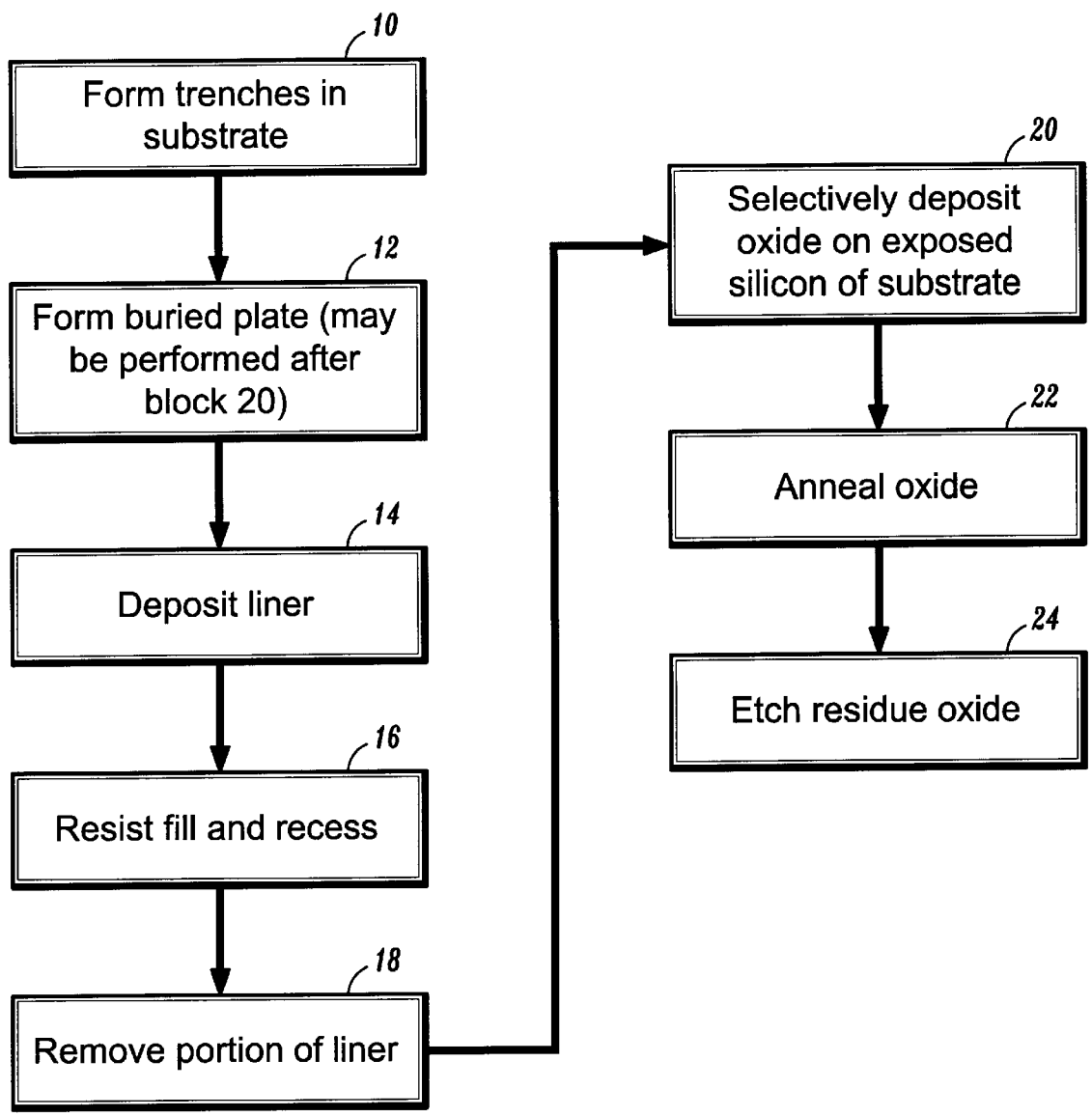
FIG. 1 is a flow diagram showing a method for selectively depositing an oxide collar in a deep trench in accordance with the present invention.

Referring now in specific detail to the drawings in which like reference numerals identify similar or identical elements throughout the several views, and initially to FIG. 1, a flow diagram is shown for a method of forming a dielectric collar by employing a selective oxide deposition process. In block 10, a deep trench is formed in a mono-crystalline substrate. A masking layer, which may include a hard mask, of, for example a silicate glass, is patterned over a pad stack (which is formed on the substrate). The substrate is etched, for example, by a reactive ion etch process, to form a deep trench in accordance with the patterned hard mask. In block 12, a buried plate may be formed in a bottom portion of the trench. The buried plate may be formed before or after a collar is formed in the trench in accordance with block 20. Formation of the buried plate may be performed by employing arsenic silicate glass (ASG) drive in process, known in the art. Alternatively, the buried plate formation can be performed after collar formation, in block 20, by a self aligned ASG process, gas phase or plasma doping.

In block 14, a liner nitride, e.g., silicon nitride, is deposited in the trench. Advantageously, a thin layer of nitride is employed, which makes the nitride easier to remove from the sidewalls of the trench. In a preferred embodiment, a nitride liner of between about 2 nm and about 3 nm is employed, and more preferably about 2.5 nm. Thicker nitrides may be employed as well. In block 16, a resist fill and recess are performed to fill the trench and then recess the resist below the level of a p-well formed adjacent to the trench. P-wells are known in the art. This recess step exposes a portion of the nitride liner, which is to be removed to expose the substrate along a portion of sidewalls of the trench. In block 18, removal of the exposed nitride liner is performed by employing an etch process, such as, for example, a dry or wet etching process, preferably selective to the resist which fills a portion of the trench. The nitride liner is removed from an area where the oxide collar will be formed. By removing the thin nitride liner the bare Si-surface is exposed. The resist is now stripped to remove it from the trench.

In block 20, a selective collar deposition process is employed to form an oxide on the exposed Si with little or no deposition on the exposed nitride liner remaining in the trench or on a nitride layer of the pad stack. The oxide formed on the exposed Si substrate (sidewalls of the trench) forms the oxide collar. In a preferred embodiment, a TEOS-Ozone oxide deposition is employed.

The ozone activated deposition is performed in a chemical vapor deposition apparatus, which is modified to provide ozone activated TEOS. The growth of TEOS in accordance with this process is selective to the exposed silicon surfaces. Significantly, less TEOS growth occurs on the nitride liner (less than about ⅕ of the growth on bare silicon). In a preferred embodiment, the ozone activated TEOS is grown by employing a gas phase deposition process.

In preferred embodiments, the TEOS-ozone layer attains a very homogeneous silicon oxide layer without fluctuations in stoichiometry by providing that at the beginning of a gas phase deposition, a gas flow ratio of TEOS to ozone is very high and subsequently is varied until a steady-state ratio is attained, in which the gas flow ratio of TEOS to ozone is low.

In an exemplary embodiment, the initial gas flow ratio of TEOS to the ozone-containing gas is approximately 10, while in the case of the steady-state gas flow ratio attained after approximately one and a half minutes, the value of 0.4 is attained.

Beginning with the initial gas flow ratio, it is advantageous initially to keep the TEOS gas flow constant and to increase the ozone gas flow. While, subsequently, the ozone gas flow is increased further up to its steady-state final value, the TEOS gas flow can be reduced down to its steady-state final value. The variation is, therefore, preferably effected nonlinearly, although a linear variation of the ratio is also possible.

By increasing the ozone (or ozone containing gas) gas flow, which is produced with an ozone generator, the proportion of oxygen in the entire gas flow also decreases simultaneously during this starting phase. This is shown in a first column of a table shown below with process parameters of an exemplary embodiment, while second and third columns indicate the gas flow of the ozone and TEOS, respectively. At a largely constant $O_2/O_3$ gas flow, the ratio of these two gases therefore varies from a low proportion of ozone to a high proportion of ozone.

The variation in the ratio of the initial gas flow conditions to the steady-state gas flow conditions is preferably carried out continuously, although in actual practice, it is performed in stages over time. To improve the conditions needed for desensitization of the deposition process, the initial gas flow ratio of TEOS to ozone is initially varied slowly, but then comparatively quickly until the steady-state final value. While the entire starting process until the steady-state final value is reached lasts about one and a half minutes, for about half of this total time the initial TEOS total flow is still constant, while the ozone-containing gas flow amounts to about two and a half times the initial value.

Overall, the ratio of the gas flows of TEOS to ozone, at this point, is approximately four. As a result of the contrary variations in the TEOS gas flow and the ozone gas flow that then ensue, the TEOS gas flow at the end of the starting process is reduced to about two-thirds of its initial value, while the ozone flow amounts to more than 15 times the initial gas flow.

The table below provides a survey of possible exemplary process parameters. Parameters, which are not listed, such as pressure and temperature, match those of a known standard process, for example, being approximately 600 Torr and approximately 400° C.

| Time | $O_2$ sccm* | $O_3$ sccm* | TEOS sccm* |
|---|---|---|---|
| 15" | 5000 | 300 | 3000 |
| 11" | 5000 | 500 | 3000 |
| 18" | 5000 | 750 | 3000 |
| 15" | 5000 | 1000 | 2800 |
| 12" | 4000 | 2000 | 2600 |
| 9" | 3000 | 3000 | 2400 |
| 6" | 2000 | 4000 | 2200 |
| 3" | 1000 | 5000 | 2000 |
| X" | — | 5000 | 2000 |

*sccm = standard cm³ of gas flow

Other selective oxide formation processes may also be employed.

Figure 2:
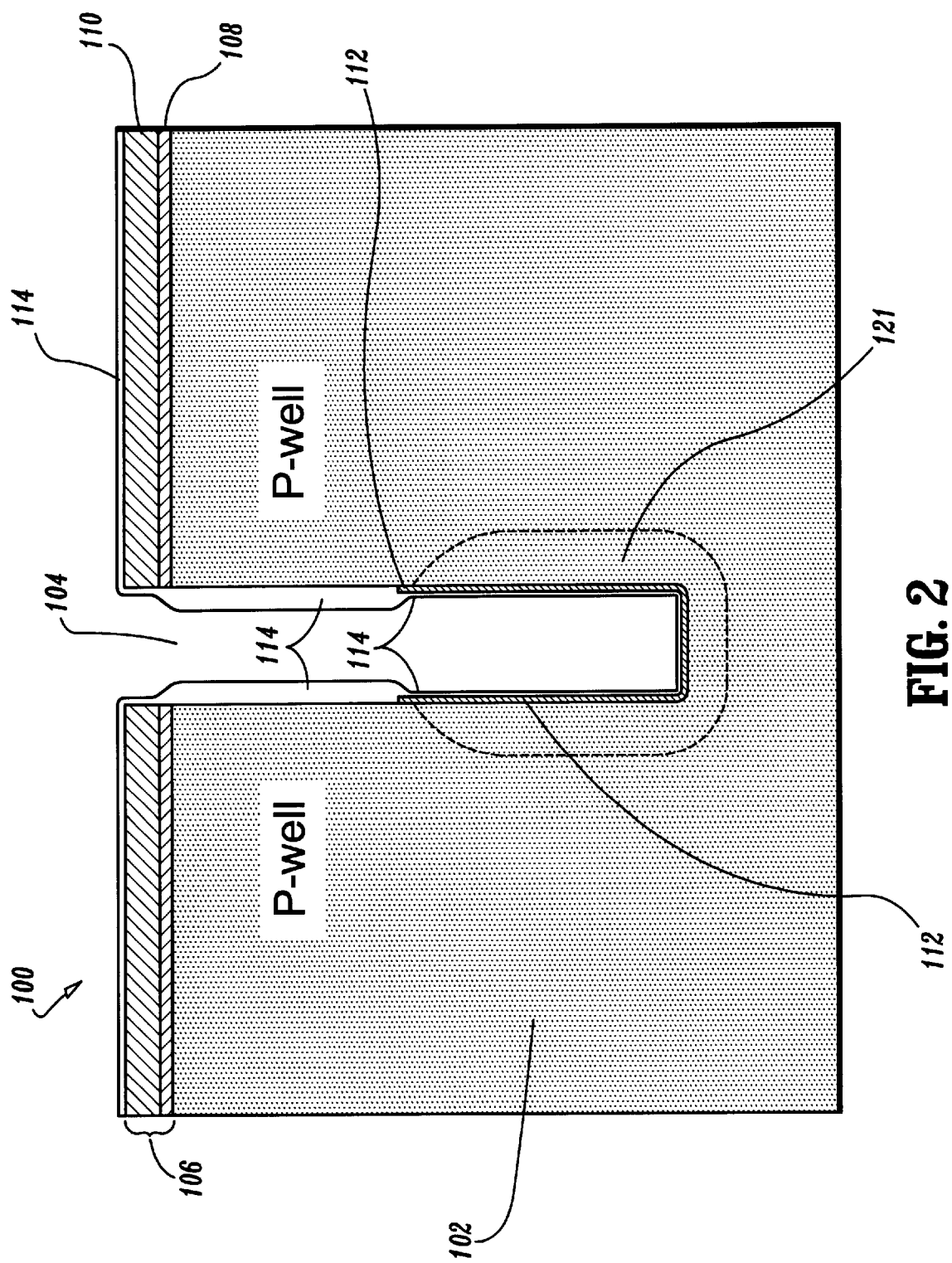
FIG. 2 is a cross-sectional view of a trench having a selectively deposited oxide formed therein in accordance with the present invention.

Referring to FIG. 2, a cross-sectional view of a partially fabricated trench capacitor cell 100 is shown in accordance with the present invention. Cell 100 includes a substrate 102 having a deep trench 104 formed therein. A pad stack 106 is formed on substrate 102. Pad stack 106 preferably includes an oxide layer 108, for example, a thermal oxide and a nitride layer 110 (e.g., silicon nitride). Trench 104 includes a nitride liner 112 which lines a lower portion of trench 104. Liner 112 is preferably formed as described above. A selectively deposited oxide layer 114 is shown for forming a collar 116 (see FIG. 3) in accordance with the present invention. Layer 114 is thicker on bare silicon regions 118 than on liner 112 and nitride layer 110 of pad stack 106. Layer 114 is preferably formed by employing an ozone activated TEOS process.

By employing such a process, the thickness of nitride liner 112 is advantageously reduced without risk of oxidizing substrate 102 through liner 112. The thinner liner 112 also provides easier removal hence maintaining the critical dimension (CD) of the opening of trench 104 (relieves excessive etching). Selective oxide deposition processes preferably employ lower temperatures for deposition, lower than for example, LOCOS processes. Temperatures in the range of between about 350° C. to about 600° C., and more preferably between about 350° C. to about 450° C., and thereby conserve the thermal budget for the fabrication process. A buried plate 121 is illustratively shown.

Returning to FIG. 1, in block 22, an optional post anneal of the selectively deposited oxide is performed. This post anneal process, if performed, is preferably in the temperature range between 700° C. and 1000° C. in an inert or oxidizing ambient. The post anneal process may be performed to densify the collar. In block 24, an etching process removes the selectively deposited oxide from the pad stack and the nitride liner. The etching process preferably includes a wet etch, for example, employing HF, or diluted HF or a dry etch. The buried plate may now be formed, if not formed previously, and processing continues as is known in the art.

Figure 3:
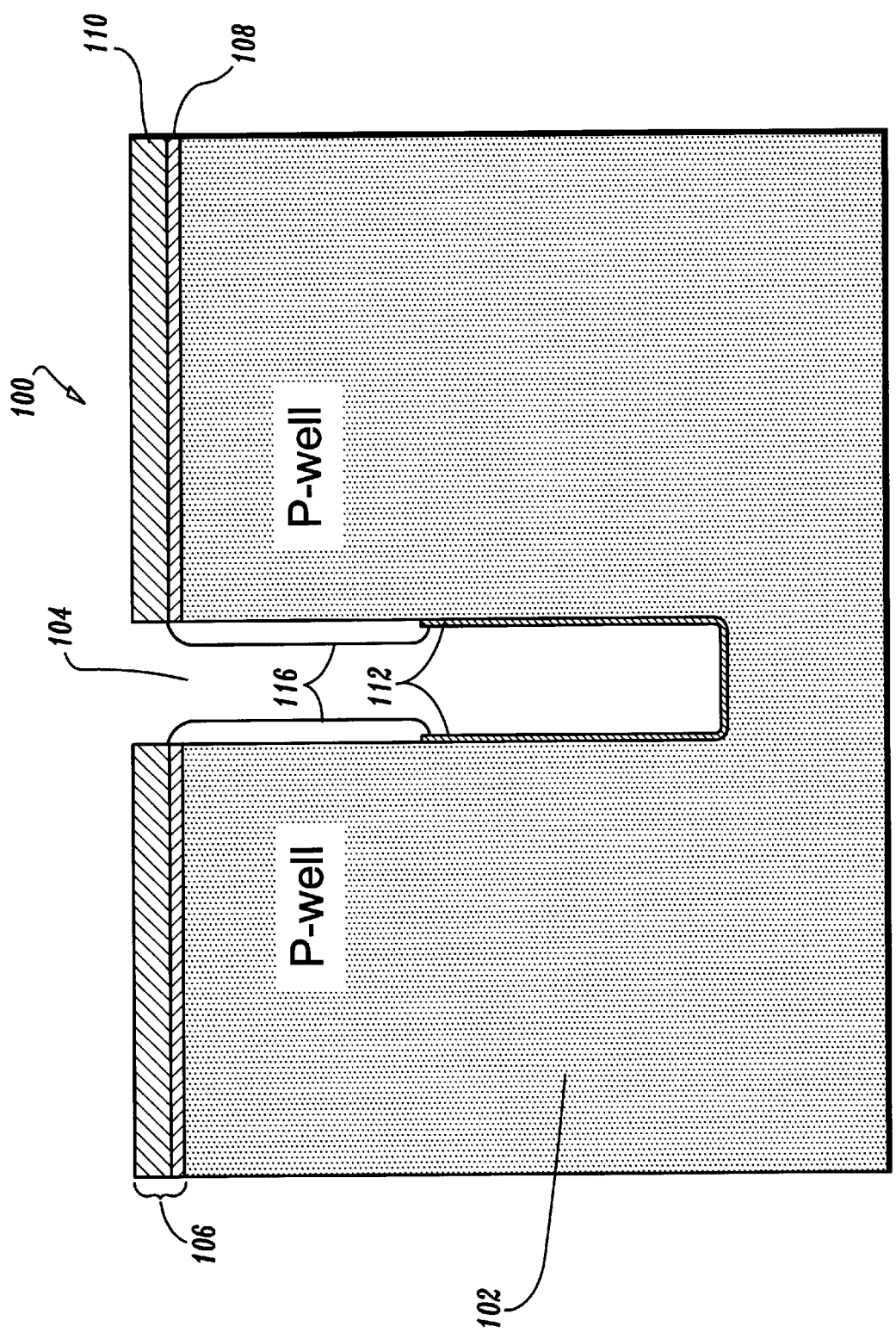
FIG. 3 is a cross-sectional view of the selectively deposited oxide etched to form the collar in accordance with the present invention.

Referring to FIG. 3, a cross-sectional view of cell 100 is shown after the etch back of the selectively deposited oxide. A collar 116 is formed, which is advantageously self-aligned to the exposed silicon of the sidewalls of trench 104 in substrate 102, since collar 116 is formed by a selective TEOS-Ozone deposition process in which the oxide is deposited selective to silicon nitride. Collar 116 is uniform in thickness (e.g., includes a thickness variation of less than about 5–7%, and is virtually independent of crystallographic orientations of the substrate 102.

The disclosed processes include at least the following advantages over the high temperature LOCOS collar formation:

1) Improved collar oxide thickness homogeneity resulting in more reliable oxides (no dependence of oxide thickness on Si-crystal orientation);

2) High selectivity to nitride liner permits thinner masking layers (easy nitride strip);

3) Low temperature;

4) Trench opening not significantly etched in removing the nitride liner; and

5) Silicon nitride is not consumed during deposition.

Having described preferred embodiments for collar formation by selective oxide deposition (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming an oxide collar in a trench, comprising the steps of:

forming a trench in a silicon substrate;

depositing and recessing a nitride liner in the trench to expose a portion of the silicon substrate on sidewalls of the trench;

depositing an ozone activated tetraethyl orthosilicate (TEOS) oxide selective to the nitride liner on the portion of the silicon substrate such that the TEOS oxide grows less on the nitride liner than on the exposed portion of the silicon substrate; and etching residue TEOS oxide from surfaces of the nitride liner to form a collar in the trench.

2. The method as recited in claim 1, wherein the step of depositing the ozone activated TEOS oxide selective to the nitride liner on the portion of the silicon substrate includes the step of providing an initial gas flow ration of TEOS to ozone of approximately 10 and attaining a steady-state gas flow ration of TEOS to ozone of 0.4.

3. The method as recited in claim 1, wherein the step of etching residue TEOS oxide from surfaces of the nitride liner to form a collar in the trench includes the step of wet etching the reside TEOS oxide.

4. The method as recited in claim 1, wherein the step of depositing and recessing a nitride liner includes the steps of:

filling the trench with a resist over the nitride liner;

recessing the resist to expose a portion of the nitride liner; and etching the nitride liner to a top level of the resist in the trench to expose the portion of the substrate in the trench.

5. The method as recited in claim 1, wherein the nitride liner is between about 2 nm and 3 nm in thickness.

6. The method as recited in claim 1, further comprising the step of forming a buried plate adjacent to a lower portion of the trench.

7. The method as recited in claim 1, further comprising the step of annealing the TEOS oxide.

8. A method for forming an oxide collar in a trench, comprising the steps of:

forming a trench in a silicon substrate;

depositing a nitride liner in the trench;

recessing the nitride liner to expose a portion of the silicon substrate on sidewalls of the trench;

depositing an ozone activated tetraethyl orthosilicate (TEOS) oxide selective to the nitride liner on the portion of the silicon substrate such that the TEOS oxide grows less on the nitride liner than on the exposed portion of the silicon substrate, wherein the TEOS oxide is substantially homogenous in thickness such that the thickness of the TEOS oxide is independent of a crystallographic orientation of the portion of the substrate on which the TEOS oxide is formed; and etching residue TEOS oxide from surfaces of the nitride liner to form a collar in the trench.

9. The method as recited in claim 8, wherein the step of depositing an ozone activated tetraethyl orthosilicate (TEOS) oxide includes the step of providing an initial gas flow ratio of TEOS to ozone of approximately 10 and attaining a steady-state gas flow ratio of TEOS to ozone of 0.4.

10. The method as recited in claim 8, wherein the step of etching residue TEOS oxide from surfaces of the nitride liner to form a collar in the trench includes the step of wet etching the reside TEOS oxide.

11. The method as recited in claim 8, wherein the step of recessing a nitride liner includes the steps of:

filling the trench with a resist over the nitride liner;

recessing the resist to expose a portion of the nitride liner; and etching the nitride liner to a top level of the resist in the trench to expose the portion of the substrate in the trench.

12. The method as recited in claim 8, wherein the nitride liner is between about 2 nm and 3 nm in thickness.

13. The method as recited in claim 8, further comprising the step of forming a buried plate adjacent to a lower portion of the trench.

14. The method as recited in claim 8, further comprising the step of annealing the TEOS oxide.

15. A method for forming an oxide collar in a trench, comprising the steps of:

forming a trench in a silicon substrate;

depositing and recessing a nitride liner in the trench to expose a portion of the silicon substrate on sidewalls of the trench, wherein the nitride liner is between about 2 nm and about 3 nm in thickness;

depositing an oxide selective to the nitride liner on the portion of the silicon substrate; and etching residue oxide from surfaces of the nitride liner to form a collar in the trench.

* * * * *